US007778242B1

(12) United States Patent
Barany et al.

(10) Patent No.: US 7,778,242 B1
(45) Date of Patent: Aug. 17, 2010

(54) PROTECTING CONTENT OF A PACKET CONTAINING SPEECH DATA USING UNEQUAL ERROR PROTECTION

(75) Inventors: Peter A. Barany, McKinney, TX (US); Denis J. D. Fauconnier, Saint Remy les Chevreuses (FR); Laurence C M-J Lautier, Plaisir (FR)

(73) Assignee: Alcatel Lucent, Paris (FR)

( * ) Notice: Subject to any disclaimer, the term of this patent is extended or adjusted under 35 U.S.C. 154(b) by 2339 days.

(21) Appl. No.: 10/262,265

(22) Filed: Oct. 1, 2002

Related U.S. Application Data

(60) Provisional application No. 60/333,629, filed on Nov. 27, 2001, provisional application No. 60/378,794, filed on May 8, 2002.

(51) Int. Cl.
*H04L 12/66* (2006.01)
(52) U.S. Cl. .................................. 370/356; 370/338
(58) Field of Classification Search ........................ None
See application file for complete search history.

(56) References Cited

U.S. PATENT DOCUMENTS

| 6,405,338 | B1 * | 6/2002 | Sinha et al. ................ 714/752 |
| 6,460,153 | B1 * | 10/2002 | Chou et al. ................ 714/746 |
| 6,571,212 | B1 * | 5/2003 | Dent ........................ 704/270.1 |
| 6,754,277 | B1 * | 6/2004 | Heinzelman et al. ... 375/240.27 |
| 6,757,860 | B2 * | 6/2004 | Choi et al. ................ 714/757 |
| 6,791,944 | B1 * | 9/2004 | Demetrescu et al. ........ 370/235 |
| 6,868,257 | B1 * | 3/2005 | Holma ...................... 455/63.1 |
| 6,956,842 | B1 * | 10/2005 | Okumura et al. ........... 370/350 |
| 6,999,432 | B2 * | 2/2006 | Zhang et al. ............... 370/328 |
| 7,031,350 | B2 * | 4/2006 | Martini et al. .............. 370/537 |
| 7,145,919 | B2 * | 12/2006 | Krishnarajah et al. ....... 370/474 |
| 7,190,732 | B2 * | 3/2007 | Chung et al. ............... 375/261 |
| 2001/0033621 | A1 * | 10/2001 | Khayrallah ................ 375/244 |
| 2002/0031122 | A1 * | 3/2002 | Martini et al. .............. 370/389 |
| 2002/0178418 | A1 * | 11/2002 | Ramprashad et al. ....... 714/755 |
| 2003/0099196 | A1 * | 5/2003 | Sebire ...................... 370/230 |
| 2005/0025188 | A1 * | 2/2005 | Numakura et al. .......... 370/490 |

OTHER PUBLICATIONS

3rd Generation Partnership Project, Technical Specification Group Services and System Aspects, "Mandatory Speech Codec Speech Processing Functions, Adaptive Multi-Rate (AMR) Speech Codec, Error Concealment of Lost Frames," Relase 5, pp. 1-13 (2002).
3rd Generation Partnership Projection, Technical Specification Group Services and System Aspects, "Mandatory Speech Codec Speech Processing Functions, Adaptive Multi-Rate (AMR) Speech Codec Frame Structure," Release 5, pp. 1-19 (2002).
3rd Generation Partneship Project, Technical Specification Group Services and System Aspects, "Mandatory Speech Codec Speech Processing Functions, Adaptive Multi-Rate (AMR) Speech Codec, Transcoding Functions," Release 5, pp. 1-55 (2002).
Lars-Ake Larzon, et al., "The UDP Lite Protocol," 16 pages, dated Jan. 24, 2002.
J. Sjoberg, et al., Network Working Group Request for Comments: 3267, "RTP Payload for AMR and AME-E+WB," pp. 1-49, dated Jun. 2002.

* cited by examiner

*Primary Examiner*—Phirin Sam
(74) *Attorney, Agent, or Firm*—Sughrue Mion, PLLC

(57) ABSTRACT

A wireless communications system includes components to apply unequal error protection to different portions of a packet containing real-time data (e.g., speech data, video data, and so forth). The packet is separated into plural portions (e.g., subflows of radio bearers), with different protection techniques applied to the plural portions.

36 Claims, 5 Drawing Sheets

PROTECTING CONTENT OF A PACKET CONTAINING SPEECH DATA USING UNEQUAL ERROR PROTECTION

CROSS REFERENCE TO RELATED APPLICATIONS

This claims the benefit under 35 U.S.C. §119(e) of U.S. Provisional Application Ser. No. 60/333,629, entitled "Intra-RTP Packet Unequal Error Protection for Voice Over IP in a Wireless Telecommunications Network," filed Nov. 27, 2001; and of U.S. Provisional Application Ser. No. 60/378,794, entitled "Mechanism for Signaling the Usage of Intra-RTP Packet UEP at the Physical Layer for UMTS Packet-Switched Voice Service Using AMR Speed Codec," filed May 8, 2002, both hereby incorporated by reference.

BACKGROUND

Packet data networks are widely used to link various types of network elements, such as personal computers, servers, network telephones, Internet appliances, and so forth. Examples of packet data networks include private networks (such as local area networks or wide area networks) and public networks (such as the Internet). Common forms of communications between network elements across packet data networks include electronic mail, file transfer, web browsing, and other exchanges of data. More recently, with the increased capacity and reliability of packet data networks, audio communications (such as voice communications), video communications (such as video conferencing), and other forms of real-time interactive or streaming communications are becoming more common in packet data networks. Traditionally, packet-data networks have been implemented on wired networks.

With advancements in wireless communications networks, efficient packet-switched communications in wireless networks have also become possible. Traditionally, wireless communications networks have been implemented as circuit-switched networks. In a circuit-switched network, a channel between two end points (e.g., two mobile stations) is occupied for the duration of the connection between the end points. Such a connection is optimal for communications that are relatively continuous, such as speech. However, circuit-switched networks are not very efficient for packet-switched communications such as e-mail, web browsing, and the like.

Several packet-switched wireless protocols have been proposed to provide more efficient packet-switched communications between a mobile station and a packet data network, such as an Internet Protocol (IP) network. One such protocol is the General Packet Radio Service (GPRS) protocol, which complements existing GSM (Global System for Mobile) communications systems. Other technologies that build upon GPRS are the Enhanced GPRS (EGPRS) technology (also referred to as Enhanced Data Rate for Global Evolution or EDGE) and EGPRS COMPACT (or EDGE COMPACT) technology, which offer higher data rates and complement GSM and IS-136 systems. Another type of wireless network that can support efficient packet-switched communications is a UMTS (Universal Mobile Telecommunication System) wireless network, which is based on the Wideband Code-Division Multiple Access (W-CDMA) protocol.

Circuit-switched wireless technology is a relatively mature technology that employs various techniques to enhance reliability and performance of circuit-switched communications of speech. For example, according to UMTS, unequal error protection (UEP) of speech bits is used to achieve optimum mean opinion scores (MOS) when using adaptive multi-rate (AMR) speech codecs. Although such mechanisms have been provided for circuit-switched speech communications, the same does not hold true for packet-switched speech communications in a wireless network. As a result, optimum performance of packet-switched communications of speech and/or other forms of real-time data in wireless networks may not be readily achievable.

SUMMARY

In general, an improved mechanism is provided to enhance the protection of speech data and/or other forms of real-time data in packet-switched communications in a wireless network. For example, according to one embodiment, a method of performing packet-switched communications in a wireless network includes forming a packet containing speech data, with the packet defined according to a protocol for packet-switched communications. The method further includes separating the packet into plural portions, and applying unequal error protection to the plural portions of the packet.

Other or alternative features will become apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments may be possible.

Figure 1:
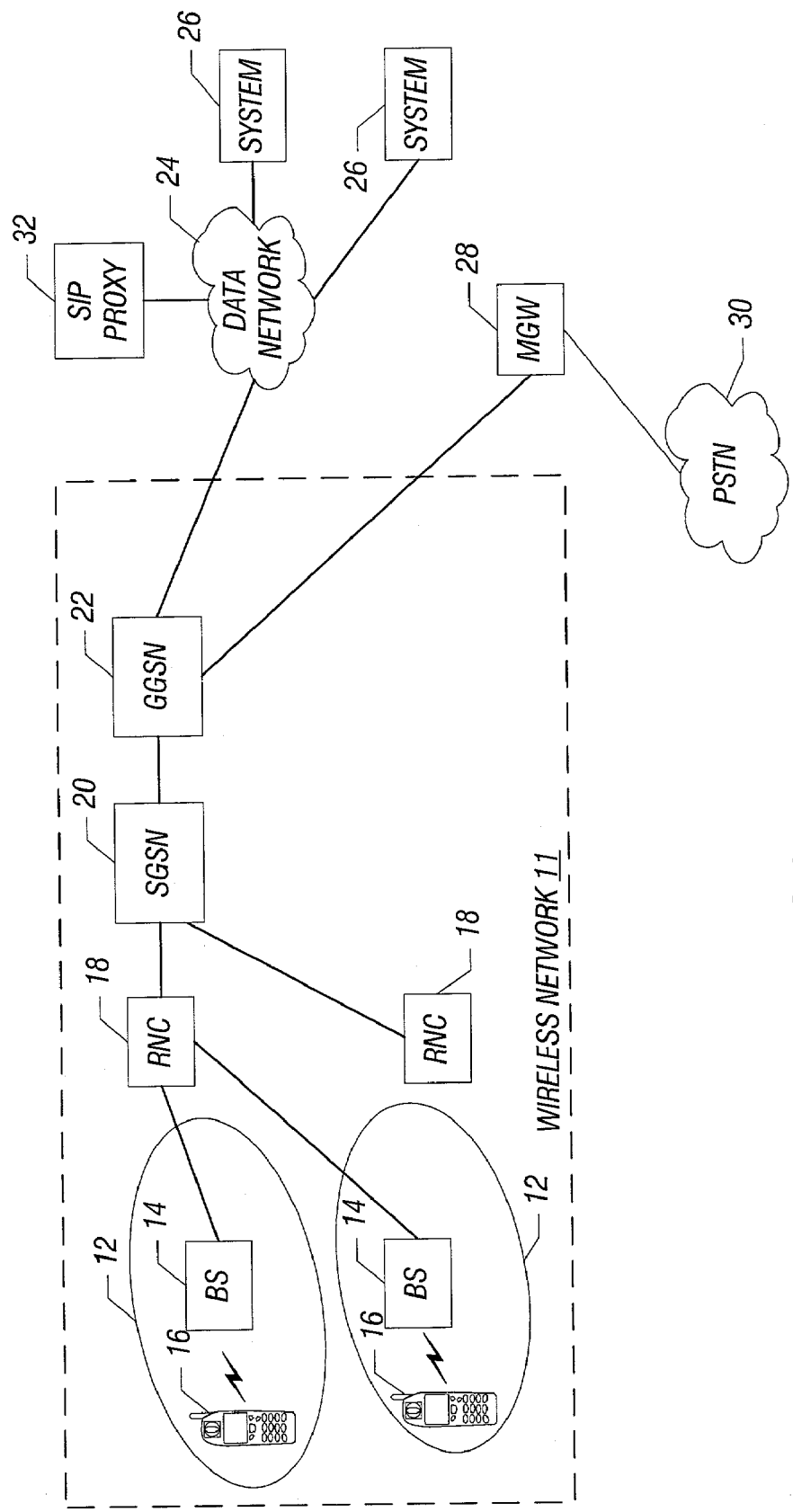
FIG. 1 is a block diagram of an example arrangement of a communications network that includes a wireless network.

Referring to FIG. 1, a communications network 10 includes a packet data network 24 and a wireless network 11. The packet data network 24 is coupled to the wireless network 11 to enable packet-switched communications between mobile stations 16 in the wireless network 11 and devices and systems 26 coupled to the packet data network 24. The wireless network 11 is made up of elements to enable communications between the mobile stations 16 and the packet data network 24. The wireless network 11 includes a number of cells or cell sectors 12, each associated with a base station 14. Each base station 14 communicates with a mobile station 16 over a wireless link. Examples of the mobile station 16 include mobile telephones, mobile computers, personal digital assistants (PDAs), and so forth. Examples of devices and systems 26 coupled to the network 24 include computers, network telephones, and so forth.

The base stations 14 are coupled to one or more radio network controllers (RNCs) 18. In one embodiment, the RNC 18 is coupled to a serving GPRS (General Packet Radio Service) support node (SGSN) 20. The SGSN 20 controls the establishment, processing, and termination of packet-switched communications with mobile stations 16. The SGSN 20 is in turn coupled to a gateway GPRS support node (GGSN) 22, which acts as the gateway between the wireless network 11 and the packet data network 24.

For communications with a device coupled to a circuit-switched network such as a public switched telephone network (PSTN) 30, a media gateway/media gateway controller 28 is provided. The media gateway 28 converts between packet-switched data and circuit-switched data.

Operations of the mobile stations 16, RNC 18, SGSN 20, and GGSN 22 are according to a UMTS (Universal Mobile Telecommunications System) standard. UMTS is based on the wideband code-division multiple access (W-CDMA) technology. Although reference is made to UMTS in the described embodiments, the invention is not intended to be limited in scope to only UMTS wireless networks, since other embodiments can employ other types of wireless protocols that support packet-switched communications. In general, techniques according to some embodiments are applicable to any wireless protocol that supports packet-switched communications of data, including packet-switched voice or speech calls, packet-switched video and voice calls, web browsing, electronic mail, file transfer, text chat, and so forth. One type of packet-switched voice or speech communications is voice-over Internet Protocol (Voice-Over-IP) communications. Examples of other technologies that support packet-switched communications include CDMA 2000, 1xEV-DO, 1xEV-DV, and so forth.

Packet-switched communications, such as those provided by IP, are unlike circuit-switched communications that provide a dedicated end-to-end channel portion (e.g., a time slot or other channel) for the duration of a call session. In contrast, packet-switched communications are based on a connection-less internetwork layer. Packets or other units of data injected into a packet data network may travel independently over any path (and possibly over different paths) to a destination point. The routing of such packets is based on addresses contained in the header of the packets. Aside from IP, other types of packet-switched communications protocols are also included within some embodiments of the invention.

There are two versions of IP, with one being IPv4 described in RFC 791, entitled "Internet Protocol," dated September 1981. Another version of IP is IPv6, described in RFC 2460, entitled "Internet Protocol, Version 6 (IPv6) Specification," dated December 1998.

With voice-over-IP communications, data (including speech data) is carried in IP packets that are transmitted over a network path. An IP packet generally includes a header portion as well as a payload portion to carry the actual data. The header portion usually contains control information and address information. Further, to support communications of speech or other real-time data, each IP packet contains speech or other real-time data embedded in an RTP (Real-Time Protocol) packet. An RTP packet encapsulates real-time data, such as speech data, into the payload section of the RTP packet. RTP is described in RFC (Request for Comments) 1889, entitled "RTP: A Transport Protocol for Real-Time Applications," dated January 1996.

One of the issues associated with communications over the air interface making up the wireless link between a mobile station 16 and an RNC 18 is that the presence of noise or weak signals can cause errors to occur in data communicated over the air interface. To avoid such errors, convolutional or channel coding, interleaving, and/or other techniques can be applied to reduce the likelihood of such errors.

According to one embodiment, unequal error protection (UEP) and unequal error detection (UED) are applied to speech data contained in packets communicated over the air interface. Unequal error protection refers to the application of different convolutional and channel coding and/or interleaving techniques to different portions of the packet. More generally, a different "protection technique" (such as a coding technique or interleaving technique) is applied to different portions of the packet. The application of different protection techniques to different portions of a packet is referred to as "intra-packet" unequal error protection (UEP).

Thus, according to some embodiments, a packet formed by an endpoint of packet-switched communications is divided into separate portions, with a different protection technique applied to each portion. In other words, for a packet divided into multiple portions, several different protection techniques are applied to the multiple portions of the packet. For example, if the packet is separated into four portions, then up to four different protection techniques can be applied to the four different portions. The multiple portions of the packet are then communicated over a physical data channel in the air interface to the other endpoint.

As described in further detail below, a packet contains speech or other real-time data that can be categorized into multiple different classes, with one class of data being more sensitive to error than another class of data. The protection technique selected to protect a given portion of data depends on the class to which the portion of data belongs.

In wireless communications that involve voice, video, or other forms of real-time data, coder/decoders (codecs) are used. To enhance flexibility and robustness, adaptive multi-rate (AMR) codecs are used. An AMR codec enables the varying of the coding rate of real-time data. In the mobile or wireless context, as a mobile station moves closer to a base station, a higher codec rate can be set so that a larger quantity of voice or other real-time data can be processed. This is possible due to radio frequency (RF) signals increasing in strength as a mobile station moves closer to the base station, thereby making it possible to use less robust forward error correction, which in turn makes it possible to use a higher codec rate. However, as a mobile station moves away from a base station to the edges of a cell, a lower codec rate is used (since weaker RF signals require more processing/forward error correction).

More generally, a decision to change the AMR codec rate is based on power control measurements, which provide an indication of signal strength. Also, the decision to change the AMR codec rate can also be based on indications of congestion or lack of congestion in the wireless network 11 or packet data network 24. For example, such indications can be in the form of RTCP (Real-Time Control Protocol) reports. RTCP, which operates in conjunction with RTP, provides feedback on the quality of data distribution of a network.

The AMR codec has been adopted by UMTS for use in packet-switched communications that contain speech or other forms of real-time data. In one example, an AMR codec supports multiple encoding modes with bit rates between 4.75 and 12.2 kilobits per second (kbps). In one implementation, the sampling frequency used by an AMR codec is 8,000 hertz (Hz) and the speech encoding is performed on 20-millisecond (ms) speech frames. Another type of AMR codec is the AMR wideband (AMR-WB) codec, which is also a multi-mode speech codec that supports nine wideband speech coding modes with respective bit rates ranging from 6.6 to 23.85 kbps. In one implementation, the sampling frequency used by an AMR-WB codec is 16,000 Hz and the speech processing is performed on 20-ms frames. Although example numbers are used above for speech codec rates, sampling frequencies, and frame sizes, it is noted that different numbers can be used for other embodiments.

An RTP packet, which encapsulates real-time data, has a header portion and a payload portion. In one embodiment, the RTP payload has a particular format for the UMTS AMR codec. The RTP payload format includes a payload header, a table of contents, and speech data (in descending order of sensitivity and/or importance). The RTP payload header includes a codec mode request (CMR) field, which has a plurality of values that correspond to multiple AMR codec modes. The table of contents contains an F field to indicate whether or not the current speech frame is followed by further speech frames in the RTP payload; an FT field, which is the frame type indicator; and a Q field, to indicate whether or not the RTP payload is damaged.

The content of the RTP payload produced by an AMR codec is separated into multiple classes or categories. In one embodiment, the RTP payload is separated into four classes: the control information class, class A, class B, and class C. Intra-packet UEP is applied to the RTP packet so that the different portions (associated with different classes) of the RTP packet have different protection techniques.

Tables 1-10 below show examples of various packets that contain speech data. In the following examples, it is assumed that each packet is an RTP/UDP Lite/IPv6 packet. UDP Lite is a reduced feature version of UDP. UDP is described in RFC 768, entitled "User Datagram Protocol," dated August 1980. A version of UDP Lite is described in the following article: draft-larzon-udplite-04.txt, entitled "The UDP Lite Protocol," dated Jan. 24, 2002.

In one embodiment, one UMTS AMR codec speech frame or SID (silence descriptor) frame is carried in each RTP packet. Also, in one embodiment, it is assumed that octet-aligned operation with CRC (cyclic redundancy check) is employed by the AMR codec. The formats and modes of operation described with respect to the RTP packets referenced in this discussion are provided for purposes of illustration only. Such formats and modes of operation are not intended to limit the scope of the invention. Other embodiments can employ other types of packet formats and modes of operation.

Table 1 shows an RTP/UDP Lite/IPv6 packet for an UMTS AMR speech codec in the 12.2 kbps mode of operation. The table has 32 columns of data. In the example, rows 1-9 of Table 1 contain the RTP/UDP/IP header. The first row of Table 1 is the row containing the following pieces of information: version, traffic class, and flow label. Row 9 contains the following information: synchronization source (SSRC) identifier. Other information of the RTP/UDP/IP header, including a payload length, a next header field, and the source and destination addresses, is located between row 1 and row 9.

TABLE 1

| 0 | | | | | | | | | | 1 | | | | | | | | | | 2 | | | | | | | | | | 3 | |
|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 0 | 1 | 2 | 3 | 4 | 5 | 6 | 7 | 8 | 9 | 0 | 1 | 2 | 3 | 4 | 5 | 6 | 7 | 8 | 9 | 0 | 1 |
| version | | | | traffic class | | | | | | | | flow label | | | | | | | | | | | | | | | | | | | |
| payload length | | | | | | | | | | | | | | | | next header | | | | | | | | hop limit | | | | | | | |
| source IP address | | | | | | | | | | | | | | | | | | | | | | | | | | | | | | | |
| destination IP address | | | | | | | | | | | | | | | | | | | | | | | | | | | | | | | |
| UDP source port | | | | | | | | | | | | | | | | UDP destination port | | | | | | | | | | | | | | | |
| UDP checksum coverage | | | | | | | | | | | | | | | | UDP checksum | | | | | | | | | | | | | | | |
| V | P | X | CC | | | | M | | PT | | | | | | | sequence number | | | | | | | | | | | | | | | |
| timestamp | | | | | | | | | | | | | | | | | | | | | | | | | | | | | | | |
| synchronization source (SSRC) identifier | | | | | | | | | | | | | | | | | | | | | | | | | | | | | | | |
| CMR | | | | R | R | R | R | F | | FT | | | | Q | P | P | CRC | | | | | | | 0 | 1 | 2 | 3 | 4 | 5 | 6 | 7 |
| 8 | 9 | 10 | 11 | 12 | 13 | 14 | 23 | 15 | 16 | 17 | 18 | 19 | 20 | 21 | 22 | 24 | 25 | 26 | 27 | 28 | 38 | 141 | 39 | 142 | 40 | 143 | 41 | 144 | 42 | 145 | 43 |
| 146 | 44 | 147 | 45 | 148 | 49 | 149 | 47 | 97 | 150 | 200 | 48 | 98 | 151 | 201 | 49 | 99 | 152 | 202 | 86 | 136 | 189 | 239 | 87 | 137 | 190 | 240 | 88 | 138 | 191 | 241 | 91 |
| 194 | 92 | 195 | 93 | 196 | 94 | 197 | 95 | 198 | 29 | 30 | 31 | 32 | 33 | 34 | 35 | 50 | 100 | 153 | 203 | 89 | 139 | 192 | 242 | 51 | 101 | 157 | 204 | 55 | 105 | 158 | 208 |
| 90 | 140 | 193 | 243 | 59 | 109 | 162 | 212 | 63 | 113 | 166 | 216 | 67 | 117 | 170 | 220 | 36 | 37 | 54 | 53 | 52 | 58 | 57 | 56 | 62 | 61 | 60 | 66 | 55 | 64 | 70 | 69 |
| 68 | 104 | 103 | 102 | 108 | 107 | 106 | 112 | 111 | 110 | 116 | 115 | 114 | 120 | 119 | 118 | 157 | 156 | 155 | 161 | 160 | 159 | 165 | 164 | 163 | 169 | 168 | 167 | 173 | 172 | 171 | 207 |
| 206 | 205 | 211 | 210 | 209 | 215 | 214 | 213 | 219 | 218 | 217 | 223 | 222 | 221 | 73 | 72 | 71 | 76 | 75 | 74 | 79 | 78 | 77 | 82 | 81 | 80 | 85 | 84 | 83 | 123 | 122 | 121 |
| 126 | 125 | 124 | 129 | 128 | 127 | 132 | 131 | 130 | 135 | 134 | 133 | 176 | 175 | 174 | 179 | 178 | 177 | 782 | 181 | 180 | 185 | 184 | 183 | 188 | 187 | 716 | 226 | 225 | 224 | 229 | 228 |
| 227 | 232 | 231 | 230 | 235 | 234 | 233 | 238 | 237 | 236 | 96 | 199 | P | P | P | P | | | | | | | | | | | | | | | | |

Rows 10-18 contains the RTP packet payload. The RTP packet payload contains the payload header information, including CMR, R, R, R, R, F, FT, Q, P, P, and CRC, all in columns 0-23 in the row 10 of Table 1. The information after the payload header includes speech bits 0-243. The speech bits are separated into three portions corresponding to three different classes: class A, class B, and class C. In one example, the class A speech bits start at column 24 of row 10 and continues to column 8 of row 13. All speech bits starting from column 9 of row 13 are categorized into either class B or class C.

The payload header information and the class A speech bits are the most sensitive to errors. Therefore, the protection techniques applied to the payload header information and the class A speech bits are stronger than the protection techniques applied to the class B and class C speech bits. The term "stronger" when applied to protection techniques indicates that the protection technique provides superior protection against errors caused by various sources, such as noise, weak signals, and so forth.

For the AMR codec, the 12.2-kbps codec mode results in the RTP packet payload containing 244 bits of speech or other real-time data (bits 0-243). Table 2 below, provided for purposes of example only, summarizes the number of speech or other real-time data bits for other AMR codec modes.

TABLE 2

| AMR Codec Mode | Total Number of Speech Bits | Class A Bits | Class B Bits | Class C Bits |
| --- | --- | --- | --- | --- |
| 4.75 kbps | 95 | 42 | 53 | 0 |
| 5.15 kbps | 103 | 49 | 54 | 0 |
| 5.90 kbps | 118 | 55 | 63 | 0 |
| 6.70 kbps | 134 | 58 | 76 | 0 |
| 7.40 kbps | 148 | 61 | 87 | 0 |
| 7.95 kbps | 159 | 75 | 84 | 0 |
| 10.20 kbps | 204 | 65 | 99 | 40 |
| 12.20 kbps | 244 | 81 | 103 | 60 |

Table 3 below shows an RTP/UDP Lite/IPv6 packet for a UMTS AMR speech codec operating at 10.2 kbps mode. As with the packet shown in Table 1, the first nine rows of Table 3 contain the RTP/UDP Lite/IP header information. The header of the RTP payload is in the columns 0 through 23 of row 10, while the class A speech bits start at column 24 in row 10, and continues to column 20 in row 12. The remaining speech bits are class B and/or class C speech bits.

TABLE 3

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| --- | --- | --- | --- | --- | --- | --- | --- | --- | --- | --- | --- | --- | --- | --- | --- | --- | --- | --- | --- | --- | --- | --- | --- | --- | --- | --- | --- | --- | --- | --- | --- |
| version | | | | traffic class | | | | | | | | flow label | | | | | | | | | | | | | | | | | | | |
| payload length | | | | | | | | | | | | | | | | next header | | | | | | | | hop limit | | | | | | | |
| source IP address | | | | | | | | | | | | | | | | | | | | | | | | | | | | | | | |
| destination IP address | | | | | | | | | | | | | | | | | | | | | | | | | | | | | | | |
| UDP source port | | | | | | | | | | | | | | | | UDP destination port | | | | | | | | | | | | | | | |
| UDP checksum coverage | | | | | | | | | | | | | | | | UDP checksum | | | | | | | | | | | | | | | |
| V | | P | X | CC | | | | M | | PT | | | | | | sequence number | | | | | | | | | | | | | | | |
| timestamp | | | | | | | | | | | | | | | | | | | | | | | | | | | | | | | |
| synchronization source (SSRC) identifier | | | | | | | | | | | | | | | | | | | | | | | | | | | | | | | |
| CMR | | | | R | R | R | R | F | FT | | | | | Q | P | P | CRC | | | | | | | 7 | 6 | 5 | 4 | 3 | 2 | 1 | 0 |
| 16 | 15 | 14 | 13 | 12 | 11 | 10 | 9 | 8 | 26 | 27 | 28 | 29 | 30 | 31 | 115 | 116 | 117 | 118 | 119 | 120 | 72 | 73 | 161 | 162 | 65 | 68 | 69 | 108 | 111 | 112 | 154 |
| 157 | 158 | 197 | 200 | 201 | 32 | 33 | 121 | 122 | 74 | 75 | 163 | 164 | 66 | 109 | 155 | 198 | 19 | 23 | 21 | 22 | 18 | 17 | 20 | 24 | 25 | 37 | 36 | 35 | 34 | 80 | 79 |
| 78 | 77 | 126 | 125 | 124 | 123 | 169 | 168 | 167 | 166 | 70 | 67 | 71 | 113 | 110 | 114 | 159 | 156 | 160 | 202 | 199 | 203 | 76 | 165 | 81 | 82 | 92 | 91 | 93 | 83 | 95 | 85 |
| 84 | 94 | 101 | 102 | 96 | 104 | 86 | 103 | 87 | 97 | 127 | 128 | 138 | 137 | 139 | 129 | 141 | 131 | 130 | 140 | 147 | 148 | 142 | 150 | 132 | 149 | 133 | 143 | 170 | 171 | 181 | 180 |
| 182 | 172 | 184 | 174 | 173 | 183 | 190 | 191 | 185 | 193 | 175 | 192 | 176 | 186 | 38 | 39 | 49 | 48 | 50 | 40 | 52 | 42 | 41 | 51 | 58 | 59 | 53 | 61 | 43 | 60 | 44 | 54 |
| 194 | 179 | 189 | 196 | 177 | 195 | 178 | 187 | 188 | 151 | 136 | 146 | 153 | 134 | 152 | 135 | 144 | 145 | 105 | 90 | 100 | 107 | 88 | 106 | 89 | 98 | 99 | 62 | 47 | 57 | 64 | 45 |
| 63 | 46 | 55 | 56 | P | P | P | P | | | | | | | | | | | | | | | | | | | | | | | | |

Tables 4-10 below similarly illustrate the content of RTP/UDP Lite/IPv6 packets for a UMTS AMR speech codec operating in the following modes, respectively: 7.95 kbps mode, 7.4 kbps mode, 6.7 kbps mode, 5.9 kbps mode, 5.15 kbps mode, 4.75 kbps, and SID (silence frame) mode. In each of Tables 4-10, the RTP payload header is in row 10, at columns 0-23. In Table 4, the class A bits start at column 24 in row 10 and continue to column 2 in row 13.

TABLE 4

| 0 | | | | | | | | | | 1 | | | | | | | | | | 2 | | | | | | | | | | 3 | |
|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 0 | 1 | 2 | 3 | 4 | 5 | 6 | 7 | 8 | 9 | 0 | 1 | 2 | 3 | 4 | 5 | 6 | 7 | 8 | 9 | 0 | 1 |
| version | | | | traffic class | | | | | | | | flow label | | | | | | | | | | | | | | | | | | | |
| payload length | | | | | | | | | | | | | | | | next header | | | | | | | | hop limit | | | | | | | |
| source IP address | | | | | | | | | | | | | | | | | | | | | | | | | | | | | | | |
| destination IP address | | | | | | | | | | | | | | | | | | | | | | | | | | | | | | | |
| UDP source port | | | | | | | | | | | | | | | | UDP destination port | | | | | | | | | | | | | | | |
| UDP checksum coverage | | | | | | | | | | | | | | | | UDP checksum | | | | | | | | | | | | | | | |
| V | P | X | | CC | | | | M | | PT | | | | | | sequence number | | | | | | | | | | | | | | | |
| timestamp | | | | | | | | | | | | | | | | | | | | | | | | | | | | | | | |
| synchronization source (SSRC) identifier | | | | | | | | | | | | | | | | | | | | | | | | | | | | | | | |
| CMR | | | | R | R | R | R | F | | FT | | | | Q | P | P | | CRC | | | | | | 8 | 7 | 6 | 5 | 4 | 3 | 2 | 14 |
| 16 | 9 | 10 | 12 | 13 | 15 | 11 | 17 | 20 | 22 | 24 | 23 | 19 | 18 | 21 | 56 | 88 | 122 | 154 | 57 | 89 | 123 | 155 | 58 | 90 | 124 | 156 | 52 | 84 | 118 | 150 | 53 |
| 85 | 119 | 151 | 27 | 93 | 28 | 94 | 29 | 95 | 30 | 96 | 31 | 97 | 61 | 127 | 62 | 128 | 63 | 129 | 59 | 91 | 125 | 157 | 32 | 98 | 64 | 130 | 1 | 0 | 25 | 26 | 33 |
| 99 | 34 | 100 | 65 | 131 | 66 | 132 | 54 | 86 | 120 | 152 | 60 | 92 | 126 | 158 | 55 | 87 | 121 | 153 | 117 | 116 | 115 | 46 | 78 | 112 | 144 | 43 | 75 | 109 | 141 | 40 | 72 |
| 106 | 138 | 36 | 68 | 102 | 134 | 114 | 149 | 148 | 147 | 146 | 83 | 82 | 81 | 80 | 51 | 50 | 49 | 48 | 47 | 45 | 44 | 42 | 39 | 35 | 79 | 77 | 76 | 74 | 71 | 67 | 113 |
| 111 | 110 | 108 | 105 | 101 | 145 | 153 | 142 | 140 | 137 | 133 | 41 | 73 | 107 | 139 | 37 | 69 | 103 | 135 | 38 | 70 | 104 | 136 | P | | | | | | | | |

In Table 5 below, the class A bits start at column 24 in row 10 and continue to column 20 in row 12.

TABLE 5

| 0 | | | | | | | | | | 1 | | | | | | | | | | 2 | | | | | | | | | | 3 | |
|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 0 | 1 | 2 | 3 | 4 | 5 | 6 | 7 | 8 | 9 | 0 | 1 | 2 | 3 | 4 | 5 | 6 | 7 | 8 | 9 | 0 | 1 |
| version | | | | traffic class | | | | | | | | flow label | | | | | | | | | | | | | | | | | | | |
| payload length | | | | | | | | | | | | | | | | next header | | | | | | | | hop limit | | | | | | | |
| source IP address | | | | | | | | | | | | | | | | | | | | | | | | | | | | | | | |
| destination IP address | | | | | | | | | | | | | | | | | | | | | | | | | | | | | | | |
| UDP source port | | | | | | | | | | | | | | | | UDP destination port | | | | | | | | | | | | | | | |
| UDP checksum coverage | | | | | | | | | | | | | | | | UDP checksum | | | | | | | | | | | | | | | |
| V | P | X | | CC | | | | M | | PT | | | | | | sequence number | | | | | | | | | | | | | | | |
| timestamp | | | | | | | | | | | | | | | | | | | | | | | | | | | | | | | |
| synchronization source (SSRC) identifier | | | | | | | | | | | | | | | | | | | | | | | | | | | | | | | |
| CMR | | | | R | R | R | R | F | | FT | | | | Q | P | P | | CRC | | | | | | 0 | 1 | 2 | 3 | 4 | 5 | 6 | 7 |
| 8 | 9 | 10 | 11 | 12 | 13 | 14 | 15 | 16 | 26 | 87 | 27 | 88 | 28 | 89 | 29 | 90 | 30 | 91 | 51 | 80 | 112 | 141 | 52 | 81 | 113 | 142 | 54 | 83 | 115 | 144 | 55 |
| 84 | 116 | 145 | 58 | 119 | 59 | 120 | 21 | 22 | 23 | 17 | 18 | 19 | 31 | 60 | 92 | 121 | 56 | 85 | 117 | 146 | 20 | 24 | 25 | 50 | 79 | 111 | 140 | 57 | 86 | 118 | 147 |
| 49 | 78 | 110 | 139 | 48 | 77 | 53 | 82 | 114 | 143 | 109 | 138 | 47 | 76 | 108 | 137 | 32 | 33 | 61 | 62 | 93 | 94 | 122 | 123 | 41 | 42 | 43 | 44 | 45 | 46 | 70 | 71 |
| 72 | 73 | 74 | 75 | 102 | 103 | 104 | 105 | 106 | 107 | 131 | 132 | 133 | 134 | 135 | 136 | 34 | 63 | 95 | 124 | 35 | 64 | 96 | 125 | 36 | 65 | 97 | 126 | 37 | 66 | 98 | 127 |
| 38 | 67 | 99 | 128 | 39 | 68 | 100 | 129 | 40 | 69 | 101 | 130 | P | P | P | P | | | | | | | | | | | | | | | | |

In Table 6 below, the class A bits start at column 24 in row 10 and continue to column 17 in row 12.

TABLE 6

| 0 | | | | | | | | | | 1 | | | | | | | | | | 2 | | | | | | | | | | 3 | |
|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 0 | 1 | 2 | 3 | 4 | 5 | 6 | 7 | 8 | 9 | 0 | 1 | 2 | 3 | 4 | 5 | 6 | 7 | 8 | 9 | 0 | 1 |
| version | | | | traffic class | | | | | | | | flow label | | | | | | | | | | | | | | | | | | | |
| payload length | | | | | | | | | | | | | | | | next header | | | | | | | | hop limit | | | | | | | |
| source IP address | | | | | | | | | | | | | | | | | | | | | | | | | | | | | | | |
| destination IP address | | | | | | | | | | | | | | | | | | | | | | | | | | | | | | | |
| UDP source port | | | | | | | | | | | | | | | | UDP destination port | | | | | | | | | | | | | | | |
| UDP checksum coverage | | | | | | | | | | | | | | | | UDP checksum | | | | | | | | | | | | | | | |
| V | | P | | X | | CC | | | | M | | PT | | | | | | sequence number | | | | | | | | | | | | | |
| timestamp | | | | | | | | | | | | | | | | | | | | | | | | | | | | | | | |
| synchronization source (SSRC) identifier | | | | | | | | | | | | | | | | | | | | | | | | | | | | | | | |
| CMR | | | | R | R | R | R | F | | FT | | | | Q | P | P | | CRC | | | | | | 0 | 1 | 4 | 3 | 5 | 6 | 13 | 7 |
| 2 | 8 | 9 | 11 | 15 | 12 | 14 | 10 | 28 | 82 | 29 | 83 | 27 | 81 | 26 | 80 | 30 | 84 | 16 | 55 | 109 | 56 | 110 | 31 | 85 | 57 | 111 | 48 | 73 | 102 | 127 | 32 |
| 86 | 51 | 76 | 105 | 130 | 52 | 77 | 106 | 131 | 58 | 112 | 33 | 87 | 19 | 23 | 53 | 78 | 107 | 132 | 21 | 22 | 18 | 17 | 20 | 24 | 25 | 50 | 75 | 104 | 129 | 47 | 72 |
| 101 | 126 | 54 | 79 | 108 | 133 | 46 | 71 | 100 | 125 | 128 | 103 | 74 | 49 | 45 | 70 | 99 | 124 | 42 | 67 | 96 | 121 | 39 | 64 | 93 | 118 | 38 | 63 | 92 | 117 | 35 | 60 |
| 89 | 114 | 34 | 59 | 88 | 113 | 44 | 69 | 98 | 123 | 43 | 68 | 97 | 122 | 41 | 66 | 95 | 120 | 40 | 65 | 94 | 119 | 37 | 62 | 91 | 116 | 36 | 61 | 90 | 115 | P | P |

In Table 7 below, the class A bits start at column 24 in row 10 and continue to column 14 in row 12.

TABLE 7

| 0 | | | | | | | | | | 1 | | | | | | | | | | 2 | | | | | | | | | | 3 | |
|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 0 | 1 | 2 | 3 | 4 | 5 | 6 | 7 | 8 | 9 | 0 | 1 | 2 | 3 | 4 | 5 | 6 | 7 | 8 | 9 | 0 | 1 |
| version | | | | traffic class | | | | | | | | flow label | | | | | | | | | | | | | | | | | | | |
| payload length | | | | | | | | | | | | | | | | next header | | | | | | | | hop limit | | | | | | | |
| source IP address | | | | | | | | | | | | | | | | | | | | | | | | | | | | | | | |
| destination IP address | | | | | | | | | | | | | | | | | | | | | | | | | | | | | | | |
| UDP source port | | | | | | | | | | | | | | | | UDP destination port | | | | | | | | | | | | | | | |
| UDP checksum coverage | | | | | | | | | | | | | | | | UDP checksum | | | | | | | | | | | | | | | |
| V | | P | | X | | CC | | | | M | | PT | | | | | | sequence number | | | | | | | | | | | | | |
| timestamp | | | | | | | | | | | | | | | | | | | | | | | | | | | | | | | |
| synchronization source (SSRC) identifier | | | | | | | | | | | | | | | | | | | | | | | | | | | | | | | |
| CMR | | | | R | R | R | R | F | | FT | | | | Q | P | P | | CRC | | | | | | 0 | 1 | 4 | 5 | 3 | 6 | 7 | 2 |
| 13 | 15 | 8 | 9 | 11 | 12 | 14 | 10 | 16 | 28 | 74 | 29 | 75 | 27 | 73 | 26 | 72 | 30 | 76 | 51 | 97 | 50 | 71 | 96 | 117 | 31 | 77 | 52 | 98 | 49 | 70 | 95 |
| 116 | 53 | 99 | 32 | 78 | 33 | 79 | 48 | 69 | 94 | 115 | 47 | 68 | 93 | 114 | 46 | 67 | 92 | 113 | 19 | 21 | 23 | 22 | 18 | 17 | 20 | 24 | 111 | 43 | 89 | 110 | 64 |
| 65 | 44 | 90 | 25 | 45 | 66 | 91 | 112 | 54 | 100 | 40 | 61 | 86 | 107 | 39 | 60 | 85 | 106 | 36 | 57 | 82 | 103 | 35 | 56 | 81 | 102 | 34 | 55 | 80 | 101 | 42 | 63 |
| 88 | 109 | 41 | 62 | 87 | 108 | 38 | 59 | 84 | 105 | 37 | 58 | 83 | 104 | P | P | | | | | | | | | | | | | | | | |

In Table 8 below, the class A bits start at column 24 in row 10 and continue to column 8 in row 12.

TABLE 8

| 0 | | | | | | | | | | 1 | | | | | | | | | | 2 | | | | | | | | | | 3 | |
|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 0 | 1 | 2 | 3 | 4 | 5 | 6 | 7 | 8 | 9 | 0 | 1 | 2 | 3 | 4 | 5 | 6 | 7 | 8 | 9 | 0 | 1 |
| version | | | | traffic class | | | | | | | | flow label | | | | | | | | | | | | | | | | | | | |
| payload length | | | | | | | | | | | | | | | | next header | | | | | | | | hop limit | | | | | | | |
| source IP address | | | | | | | | | | | | | | | | | | | | | | | | | | | | | | | |
| destination IP address | | | | | | | | | | | | | | | | | | | | | | | | | | | | | | | |
| UDP source port | | | | | | | | | | | | | | | | UDP destination port | | | | | | | | | | | | | | | |
| UDP checksum coverage | | | | | | | | | | | | | | | | UDP checksum | | | | | | | | | | | | | | | |
| V | | P | | X | | CC | | | | M | | PT | | | | | | sequence number | | | | | | | | | | | | | |
| timestamp | | | | | | | | | | | | | | | | | | | | | | | | | | | | | | | |
| synchronization source (SSRC) identifier | | | | | | | | | | | | | | | | | | | | | | | | | | | | | | | |
| CMR | | | | R | | R | R | F | | FT | | | | | | Q | P | P | | CRC | | | | | | 7 | 6 | 5 | 4 | 3 | 2 | 1 | 0 |
| 15 | 14 | 13 | 12 | 11 | 10 | 9 | 8 | 23 | 24 | 25 | 26 | 27 | 46 | 65 | 84 | 45 | 44 | 43 | 64 | 63 | 62 | 83 | 82 | 81 | 102 | 101 | 100 | 42 | 61 | 80 | 99 |
| 28 | 47 | 66 | 85 | 18 | 41 | 60 | 79 | 98 | 29 | 48 | 67 | 17 | 20 | 22 | 40 | 59 | 78 | 97 | 21 | 30 | 49 | 68 | 86 | 19 | 16 | 87 | 39 | 38 | 58 | 57 | 77 |
| 35 | 54 | 73 | 92 | 76 | 96 | 95 | 36 | 55 | 74 | 93 | 32 | 51 | 33 | 52 | 70 | 71 | 89 | 90 | 31 | 50 | 69 | 88 | 37 | 56 | 75 | 94 | 34 | 53 | 72 | 91 | P |

In Table 9 below, the class A bits start at column 24 in row 10 and continue to column 1 in row 12.

TABLE 9

| 0 | | | | | | | | | | 1 | | | | | | | | | | 2 | | | | | | | | | | 3 | |
|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 0 | 1 | 2 | 3 | 4 | 5 | 6 | 7 | 8 | 9 | 0 | 1 | 2 | 3 | 4 | 5 | 6 | 7 | 8 | 9 | 0 | 1 |
| version | | | | traffic class | | | | | | | | flow label | | | | | | | | | | | | | | | | | | | |
| payload length | | | | | | | | | | | | | | | | next header | | | | | | | | hop limit | | | | | | | |
| source IP address | | | | | | | | | | | | | | | | | | | | | | | | | | | | | | | |
| destination IP address | | | | | | | | | | | | | | | | | | | | | | | | | | | | | | | |
| UDP source port | | | | | | | | | | | | | | | | UDP destination port | | | | | | | | | | | | | | | |
| UDP checksum coverage | | | | | | | | | | | | | | | | UDP checksum | | | | | | | | | | | | | | | |
| V | | P | | X | | CC | | | | M | | PT | | | | | | sequence number | | | | | | | | | | | | | |
| timestamp | | | | | | | | | | | | | | | | | | | | | | | | | | | | | | | |
| synchronization source (SSRC) identifier | | | | | | | | | | | | | | | | | | | | | | | | | | | | | | | |
| CMR | | | | R | R | R | R | F | | FT | | | | | | Q | P | P | | CRC | | | | | | 0 | 1 | 2 | 3 | 4 | 5 | 6 | 7 |
| 8 | 9 | 10 | 11 | 12 | 13 | 14 | 15 | 23 | 24 | 25 | 26 | 27 | 28 | 48 | 49 | 61 | 62 | 82 | 83 | 47 | 46 | 45 | 44 | 81 | 80 | 79 | 78 | 17 | 18 | 20 | 22 |
| 77 | 76 | 75 | 74 | 29 | 30 | 43 | 42 | 41 | 40 | 38 | 39 | 16 | 19 | 21 | 50 | 51 | 59 | 60 | 63 | 64 | 72 | 73 | 84 | 85 | 93 | 94 | 32 | 33 | 35 | 36 | 53 |
| 54 | 56 | 57 | 66 | 67 | 69 | 70 | 87 | 88 | 90 | 91 | 34 | 55 | 68 | 89 | 37 | 58 | 71 | 92 | 31 | 52 | 65 | 86 | P | | | | | | | | |

In Table 10 below, there are no class A bits, just class B and C bits that start at column 24 in row 10, and continue to column 31 in row 11.

TABLE 10

| 0 | | | | 1 | | | | | | | | | | | | 2 | | | | | | | | | | | | 3 | | | |
|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 0 | 1 | 2 | 3 | 4 | 5 | 6 | 7 | 8 | 9 | 0 | 1 | 2 | 3 | 4 | 5 | 6 | 7 | 8 | 9 | 0 | 1 |
| version | | | | traffic class | | | | | | | | flow label | | | | | | | | | | | | | | | | | | | |
| payload length | | | | | | | | | | | | | | | | next header | | | | | | | | hop limit | | | | | | | |
| source IP address | | | | | | | | | | | | | | | | | | | | | | | | | | | | | | | |
| destination IP address | | | | | | | | | | | | | | | | | | | | | | | | | | | | | | | |
| UDP source port | | | | | | | | | | | | | | | | UDP destination port | | | | | | | | | | | | | | | |
| UDP checksum coverage | | | | | | | | | | | | | | | | UDP checksum | | | | | | | | | | | | | | | |
| V | P | X | CC | | | | M | | | | PT | | | | | sequence number | | | | | | | | | | | | | | | |
| timestamp | | | | | | | | | | | | | | | | | | | | | | | | | | | | | | | |
| synchronization source (SSRC) identifier | | | | | | | | | | | | | | | | | | | | | | | | | | | | | | | |
| CMR | | | | R | R | R | R | F | | | | FT | | | | Q | P | P | | CRC | | | | 0 | 1 | 2 | 3 | 4 | 5 | 6 | 7 |
| 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | STI | mi0 | mi1 | mi2 | P |

Figure 2:
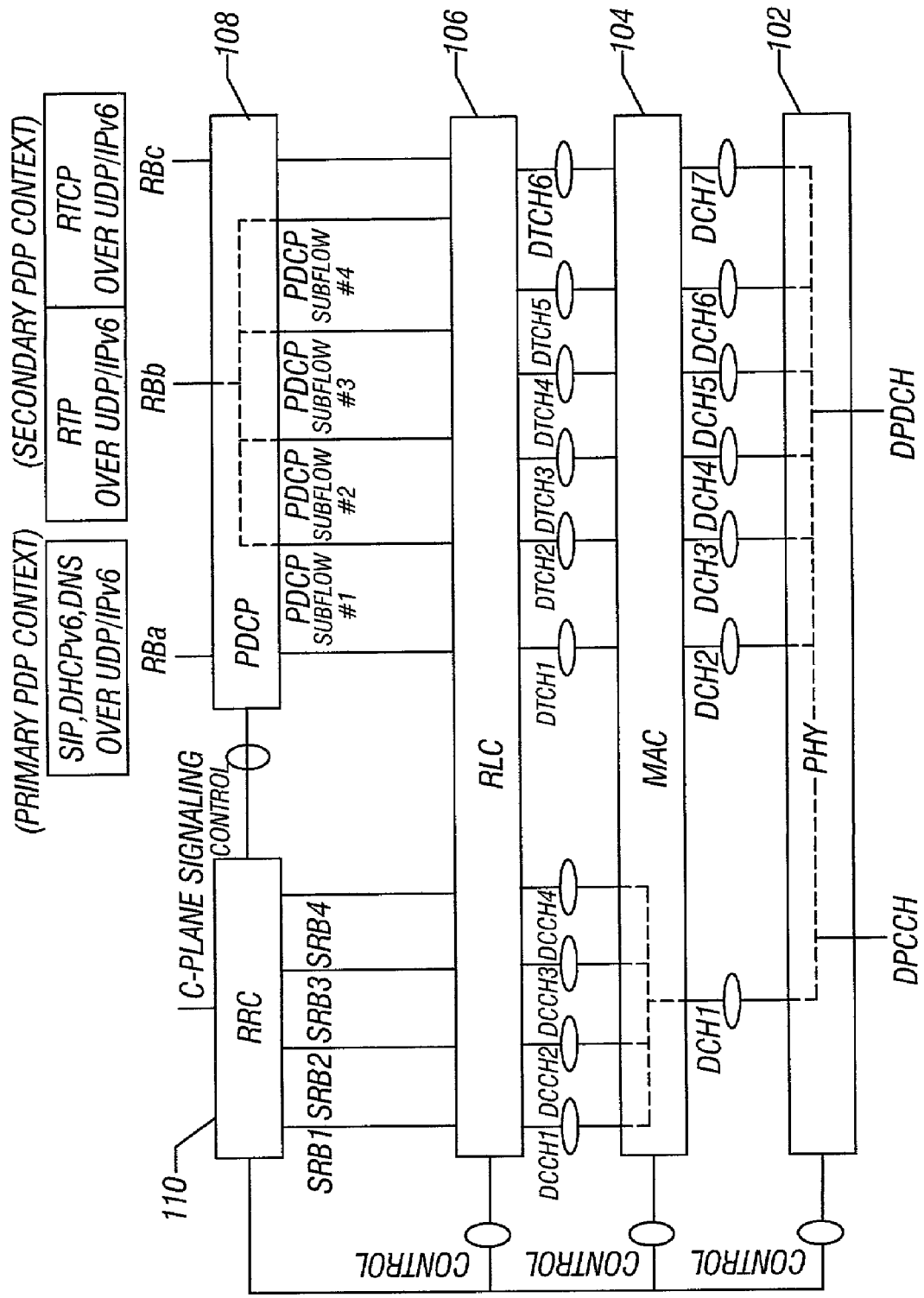
FIG. 2 is a block diagram of a radio interface architecture in one of a mobile station or a radio network controller (RNC) in the wireless network of FIG. 1.

FIG. 2 shows an example arrangement of a radio interface protocol architecture (the architecture for the radio interface between the mobile station and the RNC) that supports intra-RTP packet UEP. The radio interface protocol architecture includes a physical layer 102, such as an RF layer that is responsible for the RF signaling protocol between the mobile station and the RNC over the air interface or wireless link. Above the RF layer is a medium access control (MAC) layer 104, which controls the access signaling (request and grant) procedures for the radio channel.

Above the MAC layer 104 is a radio link control (RLC) layer 106, which provides a radio-solution-dependent reliable link. The RLC layer 106 provides the following services to higher layers: transparent data transfer service; unacknowledged data transfer service; and acknowledged transfer service. The services in the control plane are referred to as signaling radio bearers (SRBs). The services in the user plane are referred to as radio bearers (RBs).

Further layers are defined above the RLC layer 106, including a Packet Data Convergence Protocol (PDCP) layer 108, which is responsible for header compression and decompression. Further, according to some embodiments of the invention, the PDCP layer 108 is also capable of performing subflow differentiation to support the application of different protection techniques for different subflows that contain different types of information in the RTP packet, as discussed above.

The architecture of FIG. 2 also includes a radio resource control (RRC) module 110 that controls the various layers of the radio interface in response to signaling received through the physical, MAC, and RLC layers. In effect, the RRC module 110 is in the control plane of the radio interface, while the PDCP layer 108 is in the user (or bearer traffic) plane of the radio interface.

Four signaled radio bearers (SRB1, SRB2, SRB3, and SRB4) communicate control signaling between the RRC module 110 and the RLC layer 106. Four dedicated control channels (DCCH1, DCCH2, DCCH3, and DCCH4) are defined between the RLC layer 106 and MAC layer 104 for carrying control information. The mapping between SRB1-SRB4 and DCCH1-DCCH4 is as follows:

DCCH1 ⇆ SRB1
DCCH2 ⇆ SRB2
DCCH3 ⇆ SRB3
DCCH4 ⇆ SRB4

The information carried on DCCH1-DCCH4 is communicated on a dedicated channel DCCH1 between the MAC layer 104 and the physical layer 102. The physical channel for carrying control signaling is DPCCH (dedicated physical control channel), which is communicated over the radio interface between the mobile station and the RNC.

In the user plane, the bearer traffic is carried in the DPDCH (dedicated physical data channel) over the air interface. The information carried in DPDCH is mapped to the following dedicated control channels communicated between the physical layer 102 and MAC layer 104: DCH2, DCH3, DCH4, DCH5, DCH6, and DCH7. DCH2-DCH7 are mapped to dedicated traffic channels DTCH1-DTCH6 (communicated between the MAC layer 104 and RLC layer 106) according to the following:

DCH2 ⇆ DTCH1
DCH3 ⇆ DTCH2
DCH4 ⇆ DTCH3
DCH5 ⇆ DTCH4
DCH6 ⇆ DTCH5
DCH7 ⇆ DTCH6

In addition, radio bearers RBa (a=5-32), RBb (b=5-32) and RBc (c=5-32) communicate bearer traffic between the RLC layer 106 and the PDCP layer 108. Note that in accordance with some embodiments of the invention, RBb is separated into four PDCP subflows, referred to as PDCP subflow #1, PDCP subflow #2, PDCP subflow #3, and PDCP subflow #4. The mapping between DTCH1-DTCH6 and Rba, RBb, and RBc is as follows:

DTCH1 ⇄ RBa
DTCH2 ⇄ RBb/PDCP subflow #1
DTCH3 ⇄ RBb/PDCP subflow #2
DTCH4 ⇄ RBb/PDCP subflow #3
DTCH5 ⇄ RBb/PDCP subflow #4
DTCH6 ⇄ RBc RBa is used to carry control information for packet-switched communications, such as SIP (Session Initiation Protocol) signaling, DHCP (dynamic host configuration protocol) signaling, and DNS (domain name server) signaling. Signaling according to other protocols can be used in other embodiments for establishing packet-switched sessions (such as packet-switched calls) on a packet-switched network.

The radio bearer RBb associated with PDCP subflow #1 is used to carry the payload header, table of contents (including CRC), and class A speech bits. RBb associated with PDCP subflow #2 is used to carry class B speech bits. RBb associated with PDCP subflow #3 is used to carry class C speech bits (including any required padding bits). RBb associated with PDCP subflow #4 is used to carry the RTP/UDP/IP header information. Finally, RBc is used to carry RTCP packets.

The number of channels and signals illustrated between the various different layers or modules of the radio interface shown in FIG. 2 are provided by way of example only, as other embodiments can employ different channels or signals or different numbers of channels and signals.

Figure 3:
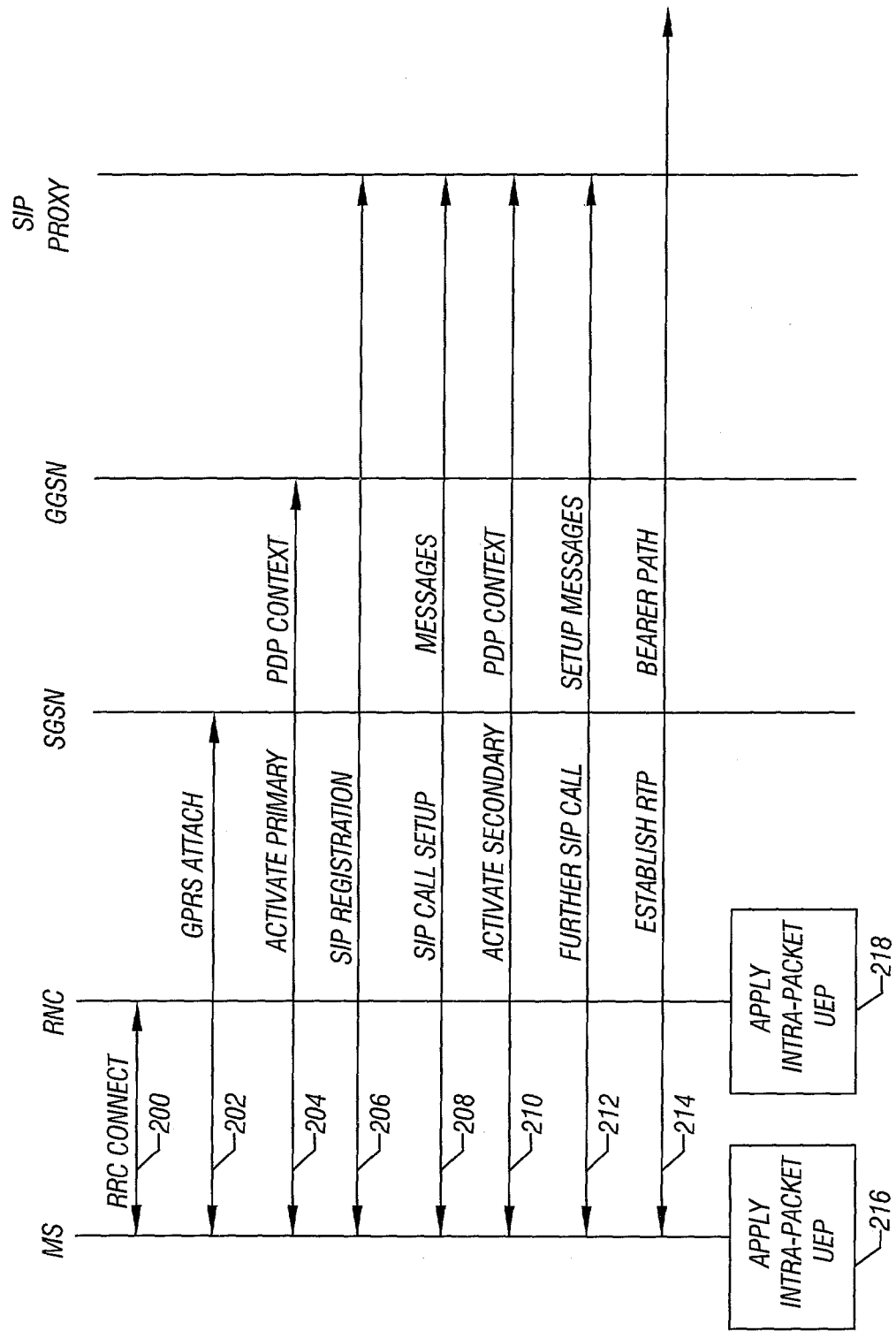
FIG. 3 is a message flow diagram of establishing a packet-switched call session in the wireless network of FIG. 1, according to one embodiment.

As shown in FIG. 3, to establish a communications session, a mobile station performs (at 200) a radio resource control (RRC) connection setup with the RNC. Next, the mobile station performs a GPRS attach procedure (at 202). The GPRS attach procedure is performed to inform the radio network that the mobile station is available.

Next, the mobile station sends (at 204) an Activate PDP (Packet Data Protocol) context request to activate a primary PDP context. RBa is assigned when the primary PDP context is activated. The primary PDP context also defines a default QoS profile, with the primary PDP context associated with one or more RBs to carry data that is subject to the QoS specified in the primary PDP context.

After the primary PDP context has been activated, a SIP registration procedure is performed (at 206). The SIP registration procedure is performed with a SIP proxy 32 (FIG. 1), which can be implemented in a call state control function (CSCF), for example. SIP registration is performed to set up the profile for the mobile station in the SIP proxy 32, so that the SIP proxy is aware of the mobile stations existence as well as various configuration information associated with the mobile station.

After SIP registration, the mobile station can initiate a packet-switched call by sending a call setup message (at 208), such as the SIP INVITE request. The call setup message is sent to the SIP proxy, which forwards the call setup message to a destination terminal.

Next, the mobile station initiates (at 210) activate secondary PDP context procedures to activate one or more secondary PDP contexts with different QoS profiles. In the example of FIG. 2, RBb is associated with one secondary PDP context, while RBc is associated with another secondary PDP context. Note that this mechanism for defining multiple RBs is an example only, as other embodiments can use other types of mechanisms.

After the secondary PDP contexts have been activated, further SIP call setup messages are exchanged (at 212) between the mobile station and the SIP proxy. After all appropriate SIP messages have been exchanged, an RTP bearer path is established (at 214). In the RTP bearer path, IP packets containing RTP payloads are exchanged between the mobile station and an endpoint with which the mobile station has established a communications session, such as a packet-switched voice call session.

In accordance with some embodiments of the invention, each of the mobile station and RNC is configured to apply intra-packet UEP (at 216 in the mobile station and at 218 in the RNC). The application of intra-packet UEP allows for superior radio communications performance across the air interface. In some embodiments, intra-packet UEP is performed at the physical layer in each of the mobile station and RNC.

In one example implementation, octet-aligned operation with CRC is employed. Further, one UMTS AMR codec speech frame or SID frame is contained in each RTP packet. Note that these features are provided as examples only, as other embodiments can have other arrangements.

In each RTP packet, information is separated into different groups, with unequal error protection applied to the information in the RTP packet. This is accomplished by grouping the information in some order (e.g., descending order) of sensitivity (such as the grouping shown in Tables 2 and 4-10 above). The strongest degree of channel encoding is applied to the most sensitive speech bits. Also, interleaving is applied to provide unequal error protection.

Further, in addition to intra-packet UEP, error concealment of lost speech packets (by use of speech substitution or muting) can be performed. Additionally, unequal error detection (UED) can be applied to certain speech bits, such as class A bits (but not class B or C bits), by protecting the class A bits with CRC (cyclic redundancy check) bits.

To enable intra-packet UEP according to some embodiments, a default UEP mode of operation with predefined parameter settings for RTP payload format for the UMTS AMR speech codec is used. In one example, the default UEP mode has predefined parameter settings according to Table 11 below, in which plural payload lengths are mapped to corresponding AMR codec modes.

TABLE 11

| RTP packet payload length (bytes) | UMTS AMR speech codec mode |
|---|---|
| 34 | 12.2 kbps |
| 29 | 10.2 kbps |
| 33 | 7.95 kbps |
| 22 | 7.4 kbps |
| 20 | 6.7 kbps |
| 18 | 5.9 kbps |
| 16 | 5.15 kbps |
| 15 | 4.75 kbps |
| 8 | SID |

Instead of the default UEP mode with the predefined parameter settings of Table 11, the information needed by the mobile station and/or RNC to map the length of an RTP payload to a specific PDCP subflow and TFCS (transport format combination set) is provided during call setup. Such information is similar to that contained in Table 11, except that the packet payload lengths corresponding to different AMR speech codec modes are different than those set forth in Table 11.

Figures 4, 5:
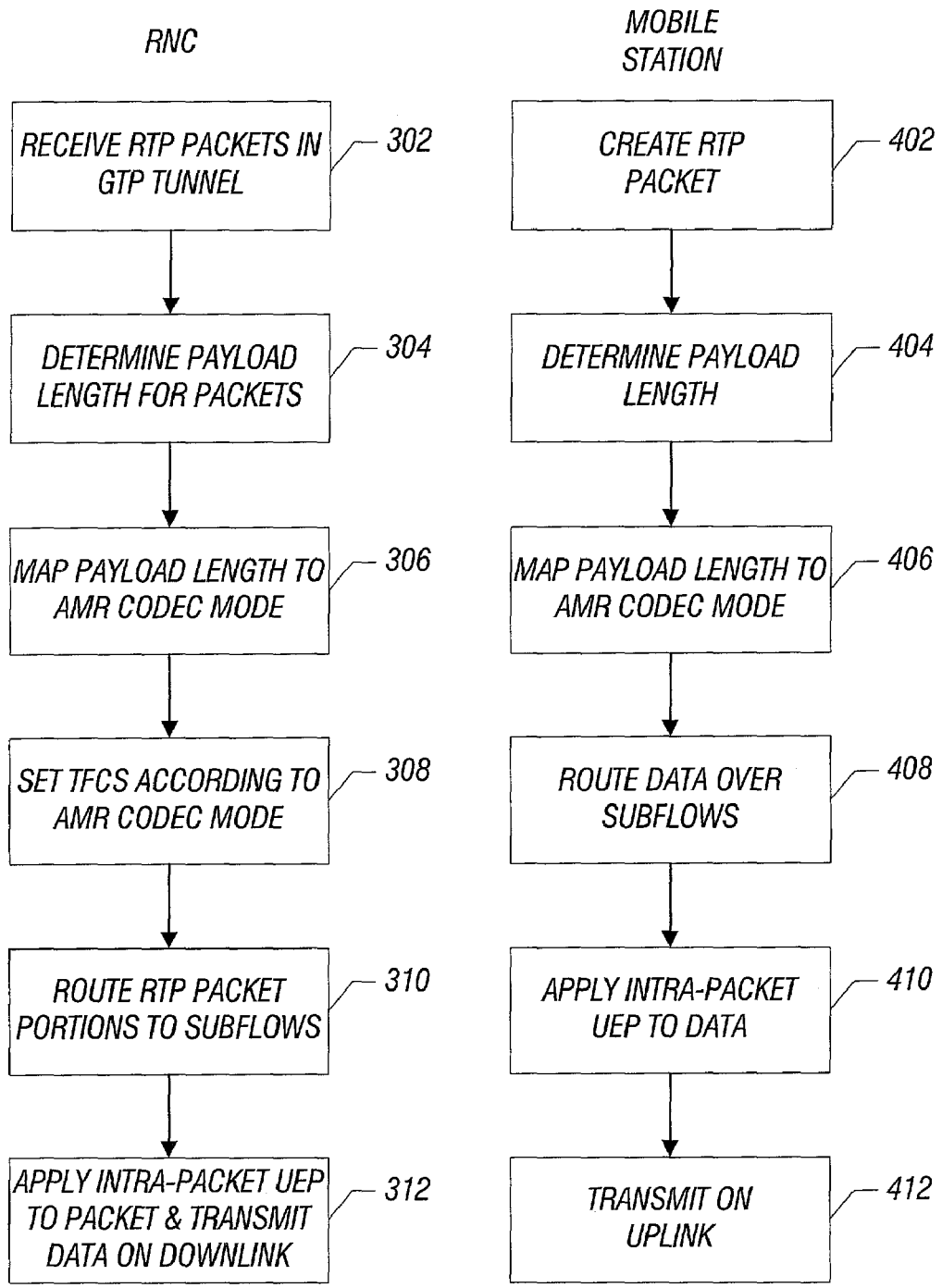
FIG. 4 is a flow diagram of a process performed by the RNC of FIG. 2 to apply unequal error protection to an outbound packet containing real-time data in downlink communications from the RNC to a mobile station.
FIG. 5 is a flow diagram of a process performed by the mobile station to apply unequal error protection to an outbound packet containing real-time data in uplink communications from the mobile station to an RNC.

Table 11 above is referred to as a lookup table to map a payload length to an AMR speech codec mode. Assuming that an RTP bearer path has been set up (214 in FIG. 3), the RNC is able to perform the necessary operations to implement intra-packet UEP (at 218). Referring to FIG. 4, the RNC receives (at 302) RTP packets in the GTP (GPRS Tunneling Protocol) tunnel. According to some embodiments, communications between the RNC and the SGSN 20 (FIG. 1) is through a GTP tunnel. After the RTP bearer path has been created, the RNC can start receiving packets from the SGSN 20 (which has forwarded data from the GGSN 22 and an entity coupled to the packet data network 24).

The RNC determines (at 304) the payload length of each packet received over the GTP tunnel. Note that due to variations in the length of the IP header and/or RTP header, the overall length of each IP packet can change. If the length of the RTP header increases from a standard length of twelve bytes, the RNC can determine the longer RTP header length by examining the "CSRC" field in the RTP header to see how many CSRC identifiers have been added. Also, an IPv6 packet can contain extension headers. This is determined by the RNC by examining the "next header" field to see how long the IPv6 header is. The "payload length" field of the IPv6 header includes extension headers in its length count. Therefore, the length of the extension header has to be subtracted out from the "payload length" field in the IP header to determine the actual length of the RTP payload.

Once the payload length has been determined (at 304), the payload length is mapped (at 306) to an AMR codec mode according to Table 11. Once the codec mode is known, the RNC is able to set (at 308) the appropriate TFCS. Note that each codec mode is associated with a corresponding TFCS. The TFCS that is activated depends on the active codec mode. The activated TFCS determines how the different portions of the packet are routed over the PDCP subflows and channels across the multiple layers of the radio interface shown in FIG. 2.

The different portions of the RTP packet (including the RTP/UDP/IP header information, the payload header, table of contents, class A speech bits, class B speech bits, and class C speech bits) are routed (at 310) over the appropriate PDCP subflows on the radio bearer RBb. Different protection techniques (including channel coding and interleaving) are applied to the different portions of the RTP packet. The data is transmitted on the downlink to the mobile station to the physical data channel (DPDCH). In some embodiments, a transport format combination indicator (TFCI) is communicated over the air interface so that the receiving end (the mobile station) is able to map the TFCI to an appropriate TFCS to perform flow differentiation (routing of the portions of the RTP packet across corresponding channels and radio bearers).

The foregoing discussion with respect to FIG. 4 refers intra-packet UEP as applied by the RNC on outbound traffic downlink from the RNC to the mobile station. Intra-packet UEP can also be applied by the mobile station on the outbound direction of the uplink from the mobile station to the RNC. In the mobile station, in response to a user talking or an application program creating speech data, an RTP packet is created (at 402). The mobile station determines (at 404) the payload length. This is accomplished by examining the IPv6 "payload length" field to determine the length of the RTP payload. Again, the CSRC field in the RTP header and the "next header" field in the IPv6 packet are examined to determine the true length of the RTP payload.

Based on the payload length, the mobile station accesses (at 406) the lookup table (similar to Table 11) to determine the AMR codec mode. Based on the lookup table, the mobile station is able to route (at 408) the bits of the RTP packet over the appropriate PDCP subflows on RBb. Next, at the physical layer of the mobile station, intra-packet UEP is applied (at 410) to the outbound data. The outbound data is transmitted (at 412) on the physical data channel (DPDCH) over the uplink. Also, in some embodiments, the mobile station sends the TFCI to the RNC.

Data transmitted by the mobile station or RNC is received by the RNC or mobile station, respectively, over the air interface. In some cases, a TFCI is communicated with the data sent over the physical data channel. At the receiving end, the mobile station or RNC maps the TFCI to a TFCS. Based on the TFCS, the physical layer 102 of the mobile station or RNC is able to route the RTP packet portions over the appropriate ones of DCH3, DCH4, DCH5, and DCH6. Data On DCH3-6 are transported to the upper layers through DTCH2-DTCH5, respectively, and over PDCP subflows #1-4 to the PDCP layer 108.

In other embodiments, a TFCI is not sent with data. Instead, "blind detection" is performed in which all possible decoding is tried to identify the one with the least error.

According to some embodiments, UDP Lite is used as the transport layer protocol to support intra-packet UEP at the physical layer of the mobile station or RNC. UDP Lite has the following benefits when compared to regular UDP. Regular UDP defines a checksum that covers the entire datagram or packet, or nothing at all. For IPv6, the UDP checksum is mandatory and cannot be disabled because the IPv6 header does not have its own checksum, unlike in the IPv4 header. Therefore, with regular UDP and IPv6, if the checksum fails, the receiving application discards the entire datagram.

Generally, for packet-switched call sessions involving speech or other real-time data, AMR and AMR-WB speech codecs are better equipped to deal with errors in the RTP payload, such as by using speech frame and SID frame substitution, otherwise known as error concealment. This type of error handling is superior to losing the entire packet by discarding the entire packet. Therefore, by using UDP Lite, a checksum with optional partial coverage of the packet can be defined. In one implementation, the checksum coverage field as defined by UDP Lite can be set to indicate that the UDP Lite checksum covers the UDP Lite header, and the payload header and table of contents field of the RTP payload for either AMR or AMR-WB speech codecs. In other words, the class A, B, and C speech bits of the AMR/AMR-WB speech codec are not covered by the UDP Lite checksum.

If the UDP Lite checksum fails, the entire datagram is discarded. Note that the UDP Lite checksum fails only if there has been an error in the UDP Lite header, the RTP header, and the payload and table of contents field of the RTP payload. These are critical control information needed to properly process the RTP packet. Note that the packet is not discarded if there has been an error in the class A, class B, or class C speech bits, which enables the AMR or AMR-WB speech codec to implement error concealment by speech frame and SID frame substitution.

Another issue associated with the use of UDP Lite is that currently, UDP Lite does not have its own protocol identifier to distinguish a UDP Lite packet from a regular UDP packet. Unfortunately, there is currently no standardized way for an originating end point to indicate to a terminating end point that UDP Lite is the transport layer protocol for RTP. Therefore, if a terminating endpoint does not support UDP Lite, it will simply return an ICMPv6 (Internet Control Message Protocol Version 6) Destination Unreachable message to the originating endpoint upon receiving an RDP/UDP Lite/IPv6 packet. To address this situation, a new optional parameter in SDP (Session Description Protocol) is used. One example version of SDP is described in RFC 2327, entitled "SDP: Session Description Protocol," dated April 1998. The use of the optional parameter can be used to indicate the usage of UDP Lite as the transport layer protocol for RTP during SIP call setup.

In some implementations, intra-packet UEP at the physical layer is separated into two categories, referred to as UEP_1 and UEP_2. UEP_1 is the intra-packet UEP at the physical layer that is designed to optimize speech codec error concealment functionality, which can result in as many as five PDCP subflows. The five PDCP subflows carry the following five pieces of information: RTP/UDP Lite/IPv6 compressed headers (covered by UDP Lite checksum); payload header and table of contents (covered by UDP Lite checksum); class A speech bits; class B speech bits; and class C speech bits. If desired, the class A speech bits can be combined with the payload header and table of contents information into one subflow, resulting in four instead of five subflows on RBb.

UEP_2 is the intra-packet UEP at the physical layer that is designed to make it possible to provide UDP at the physical layer for the RTP/UDP Lite/IPv6 compressed headers and the payload header and table of contents for the RTP payload. This would result in as many as three PDCP subflows that carry the following pieces of information: RTP/UDP Lite/IPv6 compressed headers (covered by the UDP Lite checksum); the payload header and table of contents; and the class A, B, and C speech bits.

Depending upon how the GTP tunnels are configured, the RNC, SGSN, and GGSN may need to support UDP Lite, in addition to support of UDP Lite by the endpoints (such as two mobile stations, a mobile station and an endpoint connected to the packet data network 24, or a mobile station and the media gateway connected to the PSTN). For example, if the tunnels between RNC and SGSN and between SGSN and GGSN are configured with IPv4 as the network layer protocol and regular UDP as the transport layer protocol, then the regular UDP checksum can be turned off. In this case, use of UDP Lite is not needed to support intra-packet UEP. However, if the tunnels are configured with IPv6 as the network layer protocol, then UDP Lite is needed to support intra-packet UEP, as discussed above.

According to one embodiment of the invention, the content of the activate secondary PDP context request message can be expanded to indicate that the originating mobile station desires to use UDP Lite as the transport layer protocol for RTP. In response to the activate secondary PDP context Request that contains such an indication of the desire to use UDP Lite, each of the RNC, SGSN, and GGSN can respond with an activate secondary PDP context Accept message to notify the mobile station that such entities are able to support UDP Lite.

Whether intra-packet UEP can be used is based on capabilities of the endpoints of a packet-switched call involving a mobile station and another mobile station, an entity connected to the packet-data network and the media gateway connected to the PSTN. In the call flow, it is determined (at 502) if the originating mobile station supports UDP Lite. If not, then neither UEP_1 nor UEP_2 shall be performed (at 504). However, if the originating mobile station does support UDP Lite, the call flow next determines (at 506) if the originating mobile station has requested usage of UDP Lite as the transport layer protocol for RTP during the SIP/SDP call setup. If not, then intra-packet UEP is not performed at (at 508). However, if the originating mobile station did request usage of UDP Lite, then the call flow determines (at 510) whether or not the terminating endpoint supports UDP Lite. If not, then UEP_1 and UEP_2 are not performed (at 512).

However, if the terminating endpoint does support UDP Lite, it is determined (at 514) whether or not the terminating endpoint has accepted usage of UDP Lite. If not, then neither UEP_1 nor UEP_2 is performed (at 516). However, if the terminating endpoint does accept usage of UDP Lite, then it is determined (at 518) whether or not the originating mobile station has requested usage of the default mode (as discussed above) during SIP/SDP call setup. If the originating mobile station has not requested usage of default mode, then UEP_2 is performed (at 520). However, if the originating mobile station has requested default mode, then it is determined (at 522) whether or not the terminating endpoint accepts usage of default mode. If not, then UEP_2 is performed (at 524). However, if the terminating endpoint accepts usage of default mode, then UEP_1 is performed (at 526).

Figure 6:
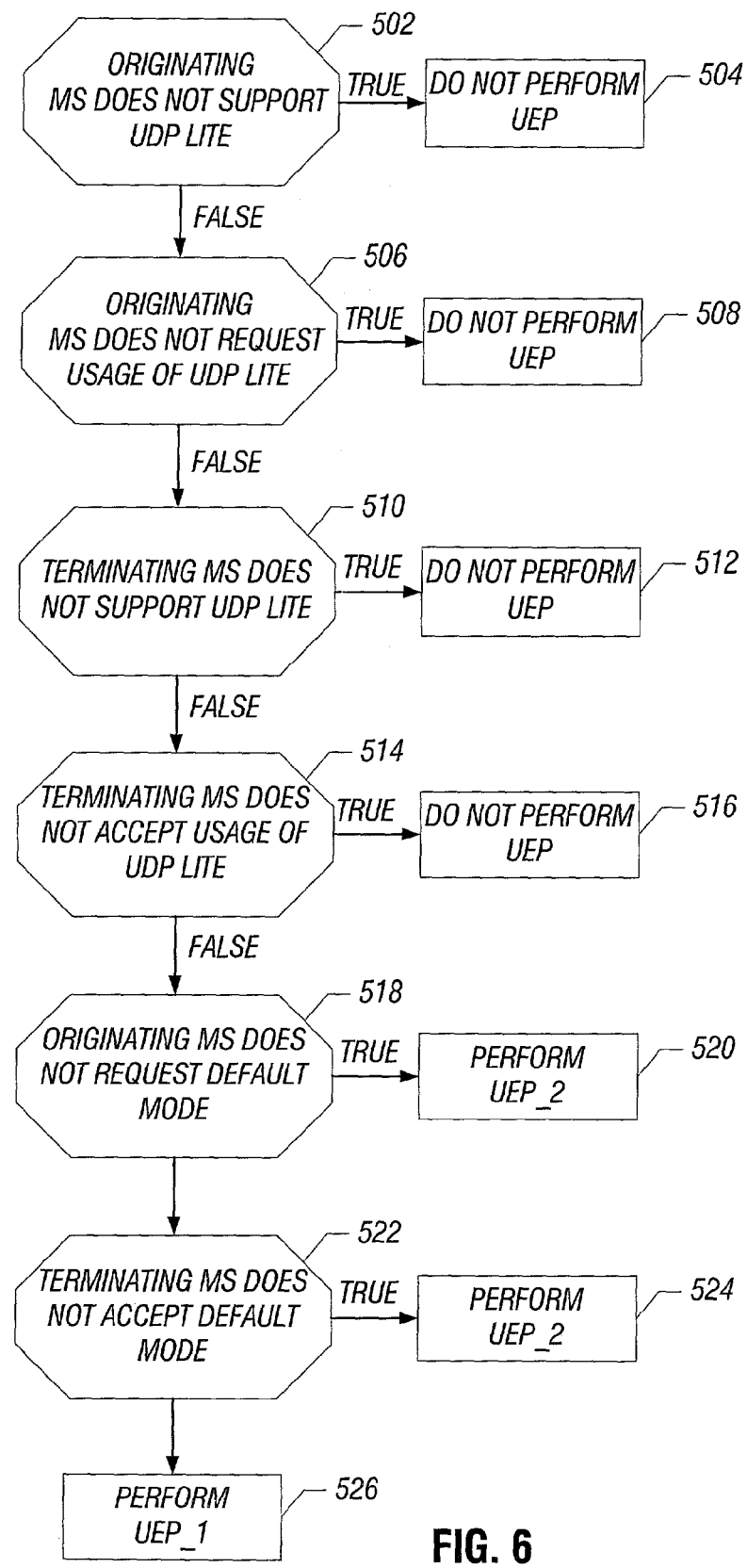
FIG. 6 is a flow diagram of a signaling process to determine if unequal error protection can be applied.

Whether intra-packet UEP is performed thus depends on whether a predetermined transport layer is supported, requested, and accepted by endpoints of the call session. The flow described above for FIG. 6 is performed by the originating mobile station and/or by the RNC.

Instructions of the various software routines or modules discussed herein (such as the modules or layers in the radio interface as well as other modules or routines in each mobile station or RNC) are stored on one or more storage devices in the corresponding systems and loaded for execution on corresponding control units or processors. The control units or processors include microprocessors, microcontrollers, processor modules or subsystems (including one or more microprocessors or microcontrollers), or other control or computing devices. As used here, a "controller" refers to hardware, software, or a combination thereof. A "controller" can refer to a single component or to plural components (whether software or hardware).

Data and instructions (of the various software modules and layers) are stored in respective storage units, which can be implemented as one or more machine-readable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs).

The instructions of the software modules or layers are loaded to each device or system in one of many different ways. For example, code segments including instructions stored on floppy disks, CD or DVD media, a hard disk, or other interface device are loaded into the device or system and executed as corresponding software modules or layers.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A method of performing packet-switched communications in a wireless network, comprising:
   forming, by a processor, a packet containing speech data, the packet defined according to a protocol for packet-switched communications;
   separating the packet into different portions;
   applying unequal error protection on the portions; and
   transmitting data containing the portions over a wireless link, wherein the applying unequal error protection on the portions comprises applying at least one of channel coding and interleaving.

2. The method of claim 1, further comprising applying a first protection technique to a first one of the portions and a second, different protection technique to a second one of the portions.

3. The method of claim 1, wherein forming the packet comprises forming a packet containing real-time data generated by an adaptive multi-rate codec that has plural operational modes.

4. The method of claim 3, wherein forming the packet comprises forming a Real-Time Protocol (RTP) packet, the RTP packet containing a payload having a length dependent upon the mode that the adaptive multi-rate codec is operating in.

5. The method of claim 1, wherein separating the packet into different portions comprises separating the packet into different subflows of a radio bearer.

6. The method of claim 5, wherein separating the packet into different subflows comprises separating the packet into different Packet Data Convergence Protocol (PDCP) subflows.

7. The method of claim 5, further comprising communicating the subflows over channels across layers of a radio interface.

8. The method of claim 7 wherein communicating the subflows over the channels across a physical layer, a medium access control (MAC) layer, and a radio link control (RLC) layer.

9. The method of claim 1, wherein transmitting the data comprises transmitting from a first entity, the method further comprising:
   a second entity receiving the data transmitted over the wireless link; and
   the second entity routing portions of the data over different subflows in the second entity.

10. An article comprising at least one storage medium containing instructions that, when executed by a computer, cause a system to perform:
   receiving a packet defined according to a protocol for packet-switched communications;
   determining a length of a payload section of the packet;
   separating the packet into plural portions based upon the determined length of the payload section,
   applying unequal error protection on the plural portions; and
   communicating the portions between layers of a radio interface over respective data paths, wherein the applying unequal error protection on the portions comprises applying at least one of channel coding and interleaving.

11. The article of claim 10, wherein the instructions when executed cause the system to determine the length of the payload section by determining the length of a Real-Time Protocol packet payload section.

12. The article of claim 10, wherein communicating the portions between layers of a radio interface over respective data paths comprises communicating the portions over plural subflows.

13. The article of claim 10, wherein communicating the portions over plural subflows comprises communicating the portions over plural PDCP subflows.

14. An apparatus capable of communicating over a wireless link of a wireless communications network, comprising:
   an interface which interfaces to the wireless link; and
   a controller which performs packet-switched communications over the wireless link in which packets are sent over the wireless link and applies unequal error protection to each packet transmitted over the wireless link,
   wherein the packets are defined according to a protocol for packet-switched communications; and
   wherein the controller applies unequal error protection by applying different protection techniques to different portions of each packet and the applying of each of the protection techniques comprises applying at least one of channel coding and interleaving.

15. The apparatus of claim 14, further comprising a mobile station containing the interface and the controller.

16. The apparatus of claim 14, further comprising a radio network controller containing the interface and the controller.

17. The apparatus of claim 14, wherein the interface is defined according to a Universal Mobile Telecommunication System (UMTS) protocol.

18. The apparatus of claim 14, wherein the packet contains real-time data generated by an adaptive multi-rate codec that has plural operational modes.

19. The apparatus of claim 18, wherein the packet comprises a Real-Time Protocol (RTP) packet, the RTP packet containing a payload having a length dependent upon the mode of the adaptive multi-rate codec.

20. The apparatus of claim 14, the controller to further separating each packet into different portions, the portions comprising different subflows of a radio bearer.

21. The apparatus of claim 20, wherein the different subflows comprises Packet Data Convergence Protocol (PDCP) subflows.

22. The apparatus of claim 21, wherein the interface comprises a physical layer, a medium access control (MAC) layer, and a radio link control (RLC) layer.

23. A method for use in a wireless communications network, comprising:
   communicating signaling to establish a packet-switched call session;
   determining, by a processor, whether a predetermined transport protocol is supported by each of entities involved in the packet-switched call session;
   enabling unequal error protection for the packet-switched call session at least in part in response to determining that the predetermined transport protocol is supported;
   determining if the predetermined transport protocol has been requested for the packet-switched call session; and
   disabling unequal error protection in response to determining that the predetermined transport protocol has not been requested.

24. The method of claim 23, further comprising applying unequal error protection for each packet communicated in the packet-switched call session.

25. The method of claim 24, wherein applying unequal error protection comprises applying unequal error protection to control data and bearer data in a payload section of each packet.

26. The method of claim 24, wherein applying unequal error protection comprises applying different protection techniques to different portions of each packet.

27. The method of claim 26, wherein applying each of the protection techniques comprises applying at least one of channel coding and interleaving.

28. The method of claim 23, wherein determining whether a predetermined transport protocol is supported comprises determining if a User Datagram Protocol (UDP) Lite Protocol is supported.

29. The method of claim 23, further comprising:
   determining if the predetermined transport protocol is supported by a terminating endpoint of the packet-switched call session; and disabling unequal error protection in response to determining that the terminating endpoint does not support the predetermined transport protocol.

30. The method of claim 29, further comprising:
   determining if the terminating endpoint accepts use of the predetermined transport protocol; and
   disabling unequal error protection in response to determining that the terminating endpoint does not support the predetermined transport protocol.

31. An article comprising at least one storage medium containing instructions that, when executed by a processor, cause a system in a wireless communications network to perform:
   communicating signaling to establish a packet-switched call session;
   determining whether a predetermined transport protocol is supported by each of entities involved in the packet-switched call session;
   enabling unequal error protection for the packet-switched call session at least in part in response to determining that the predetermined transport protocol is supported;
   determining if the predetermined transport protocol has been requested for the packet-switched call session; and
   disabling unequal error protection in response to determining that the predetermined transport protocol has not been requested.

32. The article of claim 31, further comprising applying unequal error protection for each packet communicated in the packet-switched call session.

33. The article of claim 31, wherein determining whether a predetermined transport protocol is supported comprises determining if a User Datagram Protocol (UDP) Lite Protocol is supported.

34. The article of claim 31, wherein the instructions when executed cause the system to further:
   determine if the predetermined transport protocol is supported by a terminating endpoint of the packet-switched call session; and
   disable unequal error protection in response to determining that the terminating endpoint does not support the predetermined transport protocol.

35. The article of claim 34, wherein the instructions when executed cause the system to further:
   determine if the terminating endpoint accepts use of the predetermined transport protocol; and
   disable unequal error protection in response to determining that the terminating endpoint does not support the predetermined transport protocol.

36. An apparatus for use in a wireless communications network, comprising:
   an interface which interfaces to the wireless communications network; and a controller which establishes a packet-switched call session, determines whether a predetermined transport protocol is supported in the packet-switched call session; enables unequal error protection for the packet-switched call session at least in part in response to determining that the predetermined transport protocol is supported; determines if the predetermined transport protocol has been requested for the packet-switched call session; and disables unequal error protection in response to determining that the predetermined transport protocol has not been requested.

* * * * *